United States Patent [19]

Furusawa et al.

[11] Patent Number: 4,769,787

[45] Date of Patent: Sep. 6, 1988

[54] SEMICONDUCTOR MEMORY DEVICE

[75] Inventors: Kazunori Furusawa, Kokubunji; Shinji Nabetani, Tokyo; Yoshiaki Kamigaki, Tokorozawa; Masaaki Terasawa, Akishima, all of Japan

[73] Assignees: Hitachi, Ltd.; Hitachi VSLI Eng. Corp., both of Tokyo, Japan

[21] Appl. No.: 888,072

[22] Filed: Jul. 22, 1986

[30] Foreign Application Priority Data

Jul. 26, 1985 [JP] Japan ................................ 60-164099
Aug. 23, 1985 [JP] Japan ................................ 60-184245

[51] Int. Cl.⁴ ................................ G11C 11/34
[52] U.S. Cl. ................................ 365/184; 365/189
[58] Field of Search ............... 365/104, 184, 185, 189; 357/23.5

[56] References Cited

U.S. PATENT DOCUMENTS 4,480,321 10/1984 Aoyama ................................ 365/189
4,630,086 12/1986 Sato et al. ........................ 365/184 X

FOREIGN PATENT DOCUMENTS 55-156370 5/1980 Japan .

OTHER PUBLICATIONS

K. Uchiumi, "16K Bit EEPROM Having the Character of Access Time 350 ns and Power Dissipation 300 mW" Nikkei Electronics, Jul. 6, 1981, pp. 193–206.

*Primary Examiner*—Joseph A. Popek
*Attorney, Agent, or Firm*—Antonelli, Terry & Wands

[57] ABSTRACT

Using a comparatively low supply voltage of, e.g., +5V and a minus gate voltage, the voltage difference between the gate of an MNOS transistor and a P-type well region in which a MNOS transistor is formed is relatively changed to execute the writing and erasing of the MNOS transistor. Thus, the potential of an N-type semiconductor substrate can be fixed to a comparatively low potential, e.g., about +5V, so that a P-channel MOSFET formed on the semiconductor substrate operates with an ordinary signal level. Consequently, an EEPROM having peripheral circuits constructed of CMOS circuits can be provided. Accordingly, reduction in the power consumption of the EEPROM can be attained.

16 Claims, 3 Drawing Sheets

SEMICONDUCTOR MEMORY DEVICE

BACKGROUND OF THE INVENTION

This invention relates to a semiconductor memory device, and more particularly to technology which is effective when applied to, for example, an EEPROM (electrically erasable programable read only memory) that is electrically written and erased.

MNOS (metal nitride oxide semiconductor) is an insulated-gate field effect transistor which has a gate insulator film of double layer structure consisting of a comparatively thin silicon oxide film (oxide) and a comparatively thick silicon nitride film (nitride) formed thereon (hereinbelow, simply termed 'MNOS transistor' or 'MNOS'). It can electrically perform, not only the writing of data to be stored, but also the erasing of stored data.

By way of example, an N-type source region and drain region spaced from each other are formed in the surface of a P-type silicon region, and a gate electrode made of N-type polycrystalline silicon is formed on the surface of the P-type silicon region between the source and drain regions, through a gate insulator film which consists of, e.g., a silicon oxide film 20 Å thick and a silicon nitride film 500 Å thick. The P-type silicon region forms the substrate gate region of the MNOS.

In the erased state or in the state in which no storage data is written, the gate voltage-drain current characteristic of the MNOS is such that the threshold voltage is a minus voltage.

In order to write or erase the storage data, the gate insulator film is subjected to a high electric field under which the injection or emission of carriers arises owing to tunneling.

In the writing operation, the ground potential or circuitry substantially equal to 0 V, for example, is applied to the substrate gate, while a high voltage of, for example, +15 V is applied to the gate.

A low voltage substantially equal to 0 V or a high voltage, e.g., +12 V is applied to the source region and drain region in accordance with data to be written.

According to the plus high voltage of the gate, a channel is induced in the surface of the silicon region between the source region and the drain region. The potential of this channel becomes equal to that of the source region and drain region. When the voltage of 0 V is applied to the source region and drain region as described above, a high electric field corresponding to the high voltage of the gate acts on the gate insulator film. As a result, electrons as carriers are injected from the channel into the gate insulator film by tunneling. Thus, the threshold voltage of the MNOS changes from a minus voltage to a plus voltage by way of example.

In the case where +12 V is applied to the source and drain regions as described above, the potential difference between the gate and the channel decreases to several volts. Such a small voltage difference is insufficient for giving rise to the injection of electrons based on tunneling. Therefore, the threshold voltage of the MNOS does not change.

On the other hand, the erasing is performed in such a way that a high voltage, e.g., +15 V is applied to the substrate gate with the gate held at 0 V, whereby tunneling in the reverse direction is generated to bring electrons as carriers back to the substrate gate.

The substrate gate is made, for example, a P-type well region which is formed in an N-type semiconductor substrate. For this reason, the N-type semiconductor substrate has its potential changed according to the potential change of the well region in order to maintain the reverse-biased state relative to the well region. Accordingly, with the EEPROM performing such writing/erasing operations, the peripheral circuit thereof is inevitably constructed of only N-channel MOSFETs formed in a separate P-type well region to which no high voltage is applied even in the writing mode. The reason is as stated below. In order to construct a CMOS circuit, a P-channel MOSFET needs to be formed on an N-type semiconductor substrate. The inventors' study has revealed that, in this case, when the substrate is brought to a high potential, e.g., +15 V according to the change of the well potential as described above, the P-channel MOSFET formed thereon has its effective threshold voltage increased by a substrate effect attributed to the high voltage and becomes inoperative with an ordinary signal level (for example, 0–+5 V).

SUMMARY OF THE INVENTION

An object of this invention is to provide an EEPROM device which realizes the CMOS circuit implementation of peripheral circuits.

Another object of this invention is to provide an EEPROM device which renders the integration density of a memory array higher.

A typical aspect of performance of the present invention will be briefly summarized below:

Using a comparatively low supply voltage, e.g., +5 V and a minus gate voltage, the voltage difference between the gate and substrate gate of an MNOS is relatively changed to execute the writing and erasing of the MNOS. Thus, the potential of a semiconductor substrate can be fixed to a comparatively low potential, e.g., about +5 V, so that a P-channel MOSFET formed on the semiconductor substrate operates with an ordinary signal level. In consequence, the MNOS can have its peripheral circuit constructed of a CMOS circuit and can therefore attain a reduced power consumption as well as a raised operating speed.

DESCRIPTION OF THE PREFERRED EMBODIMENTS

Figure 1A:
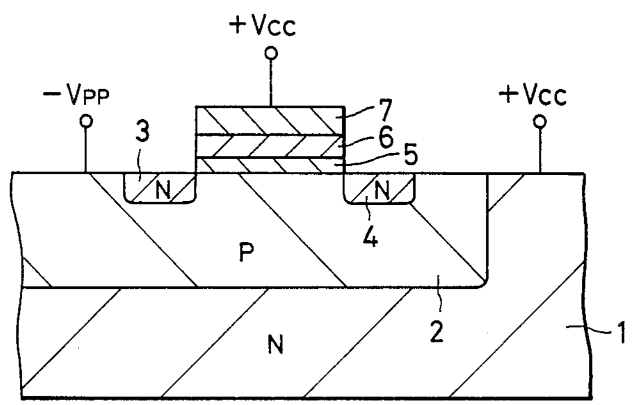
FIG. 1A is a sectional view of a memory element portion for elucidating voltage relations in the writing mode of an EEPROM of the present invention.
Figure 1B:
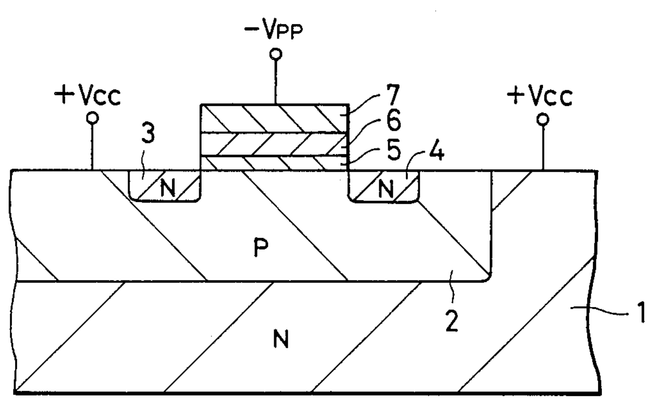
FIG. 1B is a sectional view of the memory element portion for elucidating voltage relations in the erasing mode of the EEPROM of the present invention.

FIGS. 1A and 1B show simplified sectional views of an MNOS transistor which is formed on a P-type well region 2 in an N-type semiconductor substrate 1. A channel region is formed between an $N^+$-type source region 3 and an $N^+$-type drain region 4. A gate insulator film which is interposed between the channel region and a gate electrode 7 is formed of a silicon oxide film 5 and a silicon nitride film 6.

In the writing mode, as illustrated in FIG. 1A, a plus voltage (for example, a supply voltage $V_{cc}$) is applied to the gate electrode 7, and a minus voltage $-V_{pp}$ is applied to the well region 2. The voltage of the channel region is determined according to a voltage applied to the source region 3 or the drain region 4. By endowing the channel region with a minus voltage, a high electric field is exerted on the gate insulator film, and electrons are injected into the gate insulator film on the basis of tunneling.

In the erasing mode, as illustrated in FIG. 1B, the minus voltage $-V_{pp}$ is applied to the gate electrode 7, and the plus voltage (for example, the supply voltage $V_{cc}$) is applied to the well region 2. Thus, tunneling in the reverse direction is caused, and the electrons having been injected in the writing mode are restored into the well region.

In this manner, using the comparatively low supply voltage of, e.g., +5 V and a minus gate voltage, the voltage difference between the gate and the substrate gate of the MNOS is relatively changed to execute the writing and erasing of the MNOS. Thus, the potential of the semiconductor substrate can be fixed to a comparatively low potential, e.g., about +5 V, so that a P-channel MOSFET formed on the N-type semiconductor substrate operates with an ordinary signal level. In consequence, the MNOS can have its peripheral circuit constructed of a CMOS circuit and can therefore attain a reduced power consumption as well as a raised operating speed.

Figure 2:
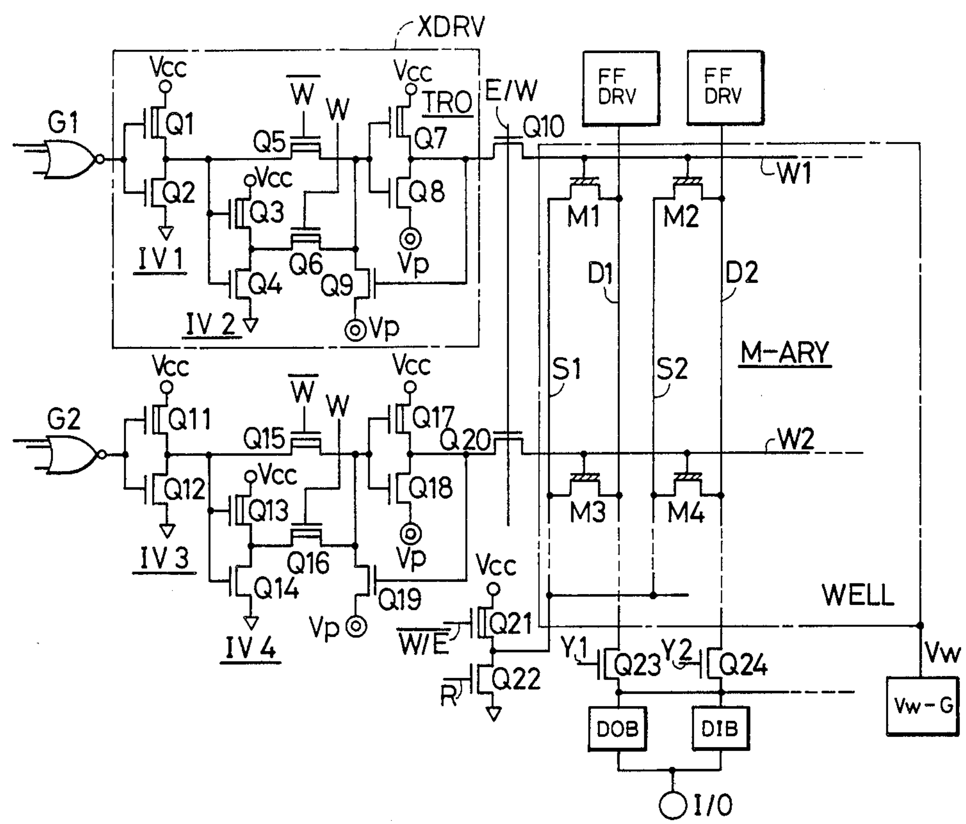
FIG. 2 is a circuit diagram of the essential portions of an EEPROM which is an embodiment of this invention.

FIG. 2 shows an embodiment of the EEPROM of the present invention in which peripheral circuits are constructed of CMOS circuits. The characterizing feature of this embodiment is that a memory cell is constructed of a single MNOS. Since each memory cell is constructed of one MNOS, the number of elements of the EEPROM can be sharply reduced. Accordingly, a higher density of integration can be attained. A memory cell in a prior art device is provided with a selecting MOSFET in addition to an MNOS.

Figure 3:
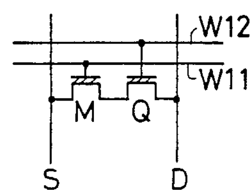
FIG. 3 is a circuit diagram of a memory cell portion which is constructed of a single MNOS and a single MOS transistor for selection.

More specifically, since an MNOS in which no data is written has a minus threshold voltage, it keeps its "on" state even when a word line with the gate of the MNOS coupled thereto is brought to a low level such as the ground potential of circuitry. Accordingly, the memory cell is provided with an address selecting MOSFET Q as shown in FIG. 3. For this reason, the number of elements constituting memory cells becomes larger in the EEPROM than in a programable ROM which electrically executes only the writing, such as an EPROM. Besides, the number of elements enlarges because circuits such as address decoders are respectively required for each of a first word line W11 to which the gate of the MNOS transistor M is coupled and a second word line W12 to which the gate of the switching MOSFET Q is coupled (as regards the MNOS, refer to, for example, the official gazette of Japanese Patent Application Laid-open No. 55-156370, which corresponds to U.S. Ser. No. 487,085, and a journal "Nikkei Electronics" dated July 6, 1981, pp. 193–206).

In this embodiment, in a reading mode, a word line not to be selected is supplied with a minus gate voltage. Thus, all the MNOSs whose gate electrodes are coupled to this word line are brought into "off" states. That is, not only the MNOSs having a plus threshold voltage, but also those having a minus threshold voltage are brought into the "off" states. Accordingly, it becomes possible to select a predetermined MNOS without providing the address selecting MOSFETs Q as shown in FIG. 3.

In the circuit of the embodiment in FIG. 2, a MOSFET of the P-channel type has a straight line added to the channel portion thereof and is thus expressed with a symbol distinguished from the symbol of an N-channel MOSFET.

In this embodiment, a minus voltage $V_p$ such as of −5 V for reading, writing and erasing operations is used besides a supply voltage $V_{cc}$ such as of about 5 V. Though not especially required, the minus voltage $V_p$ is preferably produced by a voltage generator which consists of an oscillator circuit and a rectifier circuit and which is formed on a single semiconductor substrate along with the EEPROM. Such a voltage generator can be constructed of, for example, a circuit which is similar to a known substrate back-bias voltage generator that is built in a dynamic RAM or the like.

Referring to FIG. 2, a memory array M-ARY includes MNOS transistor M1–M4 which are memory cells arranged in a matrix. The gates of the respective MNOS transistors M1 and M2 are arranged in an identical row and connected in common to a word line W1. Likewise, the gates of the MNOS transistors M3 and M4 are arranged in another identical row and respectively connected in common to a word line W2.

The drains of the MNOS transistors M1 and M3 are arranged in an identical column and connected in common to a digit (or data) line D1, and the sources thereof are connected to a common source line S1. Likewise, the drains and sources of the MNOS transistors M2 and M4 are arranged in another identical column are respectively connected to a digit line D2 and a common source line S2. Though not especially thereto, the MNOS transistors M1–M4 which constitute the memory array M-ARY preferably are formed in a common P-type well region WELL.

In this embodiment (FIG. 2), the memory cell has the address selecting switch MOSFET dispensed with and is constructed of a single MNOS transistor. Since, in this manner, the memory cell is constructed of only one MNOS transistor and the reading, writing and erasing operations thereof are achieved, the word line to which the gate of the memory cell is coupled is rendered selected/unselected by the following voltage conversion circuit XDRV which form drive signals of such ternary voltages as the supply voltage $V_{cc}$, the ground potential 0 V of the circuitry and the minus voltage $V_p$ in accordance with the reading, writing and erasing operations.

Internal address signals formed by an address buffer not shown are decoded by NOR gate circuits G1, G2 etc. each of which constructs a unit address decoder. The output signal of the gate circuit G1 is supplied to the input terminal of a CMOS inverter circuit IV1 which consists of a P-channel MOSFET Q1 and an N-channel MOSFET Q2. The output signal of the CMOS inverter circuit IV1 is, on one hand, transmitted through a transfer gate MOSFET Q5 of the P-channel type to the input terminal of an output circuit TRO of ternary levels to be described later. The output signal of the CMOS inverter circuit IV1 is, on the other hand, inverted by a CMOS inverter circuit IV2 consisting of a P-channel MOSFET Q3 and an N-channel MOSFET Q4, whereupon the inverted signal is transmitted to the input terminal of the ternary-level output circuit TRO through a transfer gate MOSFET Q6 of the P-channel type. The transfer gate MOSFETs Q5 and Q6 of the P-channel type have their gates supplied with complementary internal write signals $\overline{W}$ and W, thereby to transfer the respective signals complementarily.

The ternary-level output circuit TRO is constructed of the following circuit elements: A P-channel MOSFET Q7 and an N-channel MOSFET Q8 of CMOS inverter form are interposed between the plus supply voltage terminal $V_{cc}$ and the minus voltage terminal $V_p$. Interposed between the input terminal of this CMOS inverter circuit (Q7, Q8) and the minus voltage $V_p$ is a feedback N-channel MOSFET Q9 which receives the output signal of the CMOS inverter circuit. Besides, a transfer gate MOSFET Q10 of the N-channel type which receives an erase/write control signal E/W is interposed between the output terminal of the CMOS inverter circuit (Q7, Q8) and the word line W1 corresponding thereto. The other word lines W2 etc. are furnished with similar voltage conversion circuits which operate upon receiving the output signals of the corresponding unit address decoder circuits and the internal write signal W as well as the erase/write control signal E/W.

Though not especially required, the digit lines D1, D2 etc. of the memory array M-ARY are furnished with latch circuits FF and the driver circuits DRV constructed of the similar ternary-level conversion circuits which are operated in the writing and erasing modes. The digit lines D1, D2 etc. are coupled to a common digit line through column switch MOSFETs Q23, Q24 etc. which are controlled by select signals Y1, Y2 etc. formed by a Y address decoder not shown, respectively.

Though not especially required, the common source lines are selectively brought into the supply voltage $V_{cc}$, the ground potential 0 V of the circuitry or high impedance states by a P-channel MOSFET Q21 and an N-channel MOSFET Q22 of push-pull form. The gate of the MOSFET Q21 is supplied with a control signal $\overline{W/E}$. The MOSFET Q21 is brought into the "on" state in the writing and erasing operations, to bring the potential of the common source lines to a high level such as $V_{cc}$. The gate of the MOSFET Q22 is supplied with a control signal R. The MOSFET Q22 is brought into the "on" state in the reading operation, to bring the potential of the common source lines to the ground potential of the circuitry.

In addition, the well region WELL in which the memory cells are formed is supplied with a voltage which is formed according to the operation mode by a voltage generator Vw-G.

The signal of the common digit line is, on one hand, coupled to the input terminal of a data output buffer DOB including a sense amplifier. The data output buffer DOB is brought into its operating state in the reading operation mode, to amplify the signal of the common digit line and send it to an external terminal I/O. The data output buffer DOB has its output brought into the high impedance state when an output enable signal is at a level inhibitive of an output or when the memory device is not in the reading operation.

The external terminal I/O is also connected to the input terminal of a data input buffer DIB. The output terminal of the data input buffer DIB is coupled to the common digit line. The data input buffer DIB is brought into its operating state in the writing operation mode, to transmit to the common digit line a write signal supplied from the external terminal I/O. The write signal transmitted to the common digit line is delivered to one digit line through the column switch MOSFET brought into the "on" state by the select signal, and is fed into the corresponding latch circuit FF. In this embodiment, the write signal is supplied in synchronism with the change-over of the column switches, in other words, the change-over of Y address signals within one write cycle, whereby the write signal consisting of a plurality of bits can also be serially supplied. The data input buffer DIB has its output brought into a high impedance state when the memory device is not in the writing operation mode.

The EEPROM device of this embodiment includes a control circuit, not shown, which forms internal control signals for controlling the operations of the illustrated circuits in accordance with control signals such as a chip select signal, a program signal and an output enable signal supplied through external terminals $\overline{CS}$, $\overline{PGM}$ and $\overline{OE}$.

By way of example, when the chip select signal $\overline{CS}$ is at a high level and the program signal $\overline{PGM}$ is at a low level, the combination of these signals signifies a chip unselective mode. When the chip select signal $\overline{CS}$ and the output enable signal $\overline{OE}$ are at the low level and the program signal $\overline{PGM}$ is at the low level, the combination signifies the reading operation mode. When the chip select signal $\overline{CS}$ is at the high level and the program signal $\overline{PGM}$ is at the high level, the combination signifies the writing operation mode.

According to this embodiment, the levels of the respective operations for the MNOS transistors are set as listed in Table 1 below. In Table 1, symbol N signifies a minus or negative potential as of −5 V, and symbol P a plus or positive potential as of +5 V. Symbol 0 signifies a potential as of 0 V. Symbol F signifies a floating state. Symbol L1 signifies a high level as of 2 V or a low level as of 0 V conforming to the stored data of the MNOS. Symbol L2 signifies a level conforming to data to be written, which assumes a plus potential as of +5 V or a minus potential as of −5 V. Symbol L3 signifies that a plus potential as of +5 V is applied to the well region formed with the memory cell to be erased and that a minus potential as of −5 V is applied to those of the well regions respectively formed with the memory cells in which no memory cell to be erased is existent.

TABLE 1

| Signal | Mode | | |
|---|---|---|---|
| | Read | Write | Erase |
| Terminal voltage $V_p$ | N | N | N |
| Internal write signal W | O | O | P |
| Control signal E/W | O | P | P |
| Selected word line Wi | O | P | N |
| Unselected word line Wi' | N | N | P |
| Selected column signal Yi | P | N | N |
| Unselected column signal Yi' | O | N | N |
| Digit line D | L1 | L2 | P |
| Common source line S | O | P | P |
| Well region WELL | N | N | L3 |

The details of circuit operations in the respective operation modes are as follows:

In the writing operation, both the internal write signal W and the erase/write control signal E/W are rendered the high level ($V_{cc}$), and the inverted internal write signal $\overline{W}$ is rendered the low level (substantially 0

V). In addition, the well WELL is supplied with $-5$ V equal to the minus potential $V_p$, and the common source line S is rendered the high level (or floating state) as of $+5$ V. The low level of the internal write signal $\overline{W}$ brings transfer gate MOSFETs Q5, Q15 etc. into the "on" states and transfer gate MOSFETs Q6, Q16 etc. into the "off" states. Accordingly, if the output signal of the NOR gate circuit G1 is at the selective level of the high level, the selective signal of the low level formed by the CMOS inverter circuit IV1 is transmitted to the ternary-level output circuit TRO through the transfer gate MOSFET Q5. This signal of the low level brings the P-channel MOSFET Q7 into the "on" state and renders the output signal thereof the high level substantially equal to $V_{cc}$. Since this output signal of the high level brings the N-channel MOSFET Q9 into the "on" state, such an input signal of the output circuit TRO is lowered from the low level as of the ground potential of the circuitry down to the minus voltage $V_p$. The N-channel MOSFET Q8 is brought into the "off" state by the minus voltage $V_p$. Simultaneously therewith, the P-channel MOSFET Q5 having been held in the "on" state is brought into the "off" state for the reason that the potential (hereinbelow, termed 'source potential') of one of the two electrodes of the MOSFET Q5, coupled to the gates of the MOSFETs Q7 and Q8 is rendered the minus potential, whereby the gate voltage of the MOSFET Q5 is relatively rendered the high level. Thus, it is possible to prevent the generation of direct current through the MOSFETs Q7 and Q8 and the generation of direct current through the MOSFET Q2 of the CMOS inverter circuit IV1, the MOSFET Q5 and the MOSFET Q9. Since the MOSFET Q10 is held in the "on" state by the high level of the erase/write control signal E/W, the word line W1 is rendered the high level, e.g., substantially equal to the supply voltage $V_{cc}$ in accordance with the output of the output circuit TRO.

To the contrary, the unselected word lines W2 etc. are rendered at the low level as $-5$ V ($V_p$). More specifically, the output signal of the NOR gate circuit G2 on this occasion is rendered the unselective low level. Thus, the output signal of a CMOS inverter circuit IV3 consisting of MOSFETs Q11 and Q12 is rendered at the high level substantially equal to $V_{cc}$. Accordingly, the high level supplied through the transfer gate MOSFET Q15 brings an N-channel MOSFET Q18 into the "on" state and a P-channel MOSFET Q17 into the "off" state. Thus, as described above, the minus voltage $V_p$ as of $-5$ V is transmitted to the word line W2 through a transfer gate MOSFET Q20 held in the "on" state.

The potentials D1, D2 etc. of the respective digit lines are rendered at the minus potential as of $-5$ V in case of performing the writing operation (the injection of carriers) and are rendered at the high level as of $+5$ V in case of performing no writing, by the similar voltage conversion operations based on the driver circuits DRV responsive to the output signals of the latch circuits FF which are already holding signals to be written. Thus, as high a voltage as about 10 V is applied between the gate and channel (drain) of the MNOS to have data written therein, so that carriers are injected by tunneling. In the case where the writing is not performed, the gate and the channel (drain) become equal in potential, and hence, the injection of carriers based on the tunneling is not effected.

In the erasing operation, the inverted internal write signal $\overline{W}$ and the erase/write signal E/W are rendered at the high level ($V_{cc}$), and the noninverted internal write signal W is rendered at the low level. Besides, the well WELL is rendered at $+5$ V by the voltage generator Vw-G, and the common source line S is rendered at the high level of $V_{cc}$. In this case, contrariwise to the writing operation, the low level of the noninverted internal write signal W brings the transfer gate MOSFETs Q6, Q16 etc. into the "on" states and the transfer gate MOSFETs Q5, Q15 etc. into the "off" states. Accordingly, when the output signal of the NOR gate circuit G1 has been rendered at the selective high level, the selective signal at the high level through the CMOS inverter circuits IV1 and IV2 is transmitted to the output circuit TRO through the transfer gate MOSFET Q6. Contrariwise to the case of the writing operation, this signal of the high level brings the N-channel MOSFET Q8 into the "on" state and renders the output signal thereof a minus voltage as of the voltage $V_p$ ($-5$ V).

In contrast, the word lines W2 etc. not to be selected are rendered at the high level of $+5$ V ($V_{cc}$) conversely to the above case. More specifically, when the output signal of the NOR gate circuit G2 is at the unselective low level, it brings to the low level an output signal which passes through the CMOS inverter circuit IV3 and a CMOS inverter circuit IV4. This signal of the low level brings the P-channel MOSFET Q17 into the "on" state and renders the output signal thereof at the high level. Since an N-channel MOSFET Q19 is brought into the "on" state by the output signal of the high level, the input signal thereof is lowered from the low level as of the ground potential of the circuitry down to the minus voltage $V_p$. Owing to this minus voltage $V_p$, the N-channel MOSFET Q18 is brought into the "off" state, while the P-channel MOSFET Q16 held in the "on" state is brought into the "off" state because the source potential thereof is rendered at a negative potential, whereby the gate voltage thereof is relatively rendered at the high level. Thus, it is possible to prevent direct currents from flowing through the MOSFETs Q17 and Q18 and through the MOSFET Q13 of the CMOS inverter circuit IV4, the MOSFET Q16 and the MOSFET Q19. Since the MOSFET Q20 is held in the "on" state by the high level of the erase/write control signal E/W, the word line W2 is rendered at the high level, e.g., substantially equal to the supply voltage $V_{cc}$. In the erasing operation, the driver circuit DRV renders the potential of the digit line D1, a plus potential of $+5$ V, owing to the similar voltage conversion operation. Thus, as high a voltage as about 10 V is applied between the gate and channel (drain) of the MNOS to have data erased, in the direction opposite to the foregoing, whereby the carriers stored in the gate insulator film are restored into the well in the body.

In the reading operation, the noninverted internal write signal W is rendered at the high level, the erase/write control signal E/W is rendered at the low level (0 V) conversely to that in the writing and erasing operation modes, and the inverted internal write signal $\overline{W}$ is rendered at the low level. Besides, the well WELL is supplied with $-5$ V equal to the minus voltage $V_p$, and the common source line S is given the ground potential of the circuitry. The low level of the internal write signal W brings the transfer gate MOSFETs Q5, Q15 etc. into the "on" states and the transfer gate MOSFETs Q6, Q16 etc. into the "off" states. Accordingly, when the output signal of the NOR gate circuit G1 has been rendered at the selective signal of the high level, the selective signal of the low level through the CMOS inverter circuit IV1 is transmitted to the output circuit TRO through the transfer gate MOSFET Q5. This signal of the low level brings the P-channel MOSFET Q7 into the "on" state and renders the output signal thereof at the high level. Since the N-channel MOSFET Q9 is brought into the "on" state by this output signal of the high level, the input signal thereof is lowered from the low level as of the ground potential of the circuitry down to the minus voltage $V_p$. This minus voltage $V_p$ brings the N-channel MOSFET Q8 into the "off" state. Simultaneously therewith, the P-channel MOSFET Q5 held in the "on" state has its source potential brought to a minus potential, whereby the gate voltage thereof is relatively rendered the high level, so that this MOSFET Q5 is brought into the "off" state. Thus, it is possible to prevent direct currents from flowing through the MOSFETs Q7 and Q8 and through the MOSFET Q2 of the CMOS inverter circuit IV1, the MOSFET Q5 and the MOSFET Q9.

The gate of the MOSFET Q10 is rendered at the low level by the erase/write control signal E/W. In this case, since the word line W1 is brought to the unselective level of the minus voltage ($V_p$) beforehand, the MOSFET Q10 has its gate voltage rendered at the low level as described above. Nevertheless, this MOSFET Q10 is brought into the "on" state because the source potential (the word line W1 to be selected) is rendered at the low level relative to the gate potential. The "on" state of the MOSFET Q10 is maintained until the gate-source voltage thereof reaches the threshold voltage thereof. As a result, when the word line W1 has begun to be selected, the potential thereof is raised substantially up to the ground potential of the circuitry in accordance with the gate voltage of the MOSFET Q10.

In contrast, the unselected word lines W2 etc. are rendered at the low level of −5 V ($V_p$) likewise to the case of the writing operation. More specifically, the output signal of the NOR gate circuit G2 is held at the unselective low level. Thus, the output signal of the CMOS inverter circuit (Q11, Q12) is rendered at the high level. The signal of the high level is accordingly transmitted through the transfer gate MOSFET Q15, so that the N-channel MOSFET Q18 is brought into the "on" state, and the P-channel MOSFET Q17 into the "off" state. In this manner, the minus voltage $V_p$ of −5 V is rendered at the minus potential relative to the control signal E/W of the low level and therefore brings the MOSFET Q20 into the "on" state, so that it is transmitted to the word line W2. Thus, the MNOS transistors coupled to the unselected word lines W2 etc. are all brought into the "off" states irrespective of whether or not they are to have data written therein, in other words, even when their threshold voltages have minus potentials as of −4−−3 V.

On the other hand, as regards the MNOS transistors coupled to the selected word line W1, those having minus threshold voltages are brought into the "on" states and those having plus threshold voltages are brought into the "off" states in accordance with the storage data thereof. In this manner, the MNOS transistors are brought into the "on" states/"off" states in accordance with the storage data thereof in the reading operation. In order to distinguish the "on" states/"off" states, the voltage conversion circuits coupled to the digit lines D1, D2 etc. are brought into the non-operating states, while the digit line selected through the column switch MOSFET is fed with current through the load circuit of the sense amplifier included in the data output buffer DOB, etc., whereby the presence or absence of the current conforming to the "on" states/"-off" states is distinguished.

Though not especially required, this embodiment is so operated that, when the control signals have specified the writing operation, the memory cells coupled to one word line addressed first are read out. This reading operation is internally performed unlike the foregoing reading operation in the ordinary sense. More specifically, owing to the operation of selecting the word line, the stored data items of the memory cells corresponding thereto are read out to the respective digit lines. The read signals are once held in the latch circuits FF which are provided in correspondence with the respective digit lines. Such an internal reading operation is followed by the erasing operation. More specifically, the selected word line is rendered a minus potential as of −5 V, and the other unselected word lines are rendered a plus potential as of +5 V. Besides, the driver circuits DRV bring the respective digit lines to the plus potential (+5 V) upon receiving an erase signal. At this time, the voltage generator Vw-G brings the potential of the well WELL to a plus potential as of +5 V. Thus, all the memory cells corresponding to the single word line mentioned above are erased. Before or after this erasing operation, a write signal fed from an external terminal is transmitted to the latch circuit FF through the column switch MOSFET designated by a Y address signal and the corresponding digit line. That is, the retained data of the latch circuit FF is transposed from the read signal to the write signal. In this case, a write signal consisting of a plurality of bits can also be replaced with the stored data items of the latch circuits FF corresponding thereto by the change-over of the Y address signals. Owing to such an address switching operation (page mode), a large number of bits can be written within one write cycle, so that a high-speed writing operation can be realized.

Thereafter, for the memory cells corresponding to the single word line in the writing operation, the driver circuits DRV determine the potentials of the respective digit lines in accordance with the retained data items of the corresponding latch circuits FF. Thus, the writing of the memory cells is, in effect, performed in correspondence with the transposition of the retained data items for the latch circuits FF. In the case of the writing in single-bit unit, the data input buffer may well be provided with a driver circuit which forms a ternary level corresponding to a write signal.

According to the embodiment shown in FIG. 2, the following effects are produced:

(1) The selective/unselective levels of a memory cell are defined by the combinations of the three values of a plus voltage, the ground potential of circuitry and a minus voltage in accordance with the operation modes thereof, whereby the memory cell can be constructed of only one MNOS transistor. This dispenses with an address selecting MOSFET and therefore reduces the number of elements to constitute a memory array and dispenses with address decoders for selecting the address selecting MOSFETs, to bring forth the effect that sharp reduction in the number of elements can be attained. Thus, an EEPROM having a large storage capacity of, for example, about 1 Mbits can be realized.

(2) In the reading operation of an MNOS transistor, the selective level of a word line is set at the ground potential of circuitry, whereby the MNOS transistor having a plus threshold voltage can be brought into the "off" state thereof. Thus, the MNOS transistor can be turned "on"/"off" according to stored data so as to read it out. This brings forth the effect that the sense operation margin of this system can be rendered wider than in a system wherein a current difference proportional to the difference of conductances conforming to the difference of threshold voltages is sensed as in a prior art. Another effect is that consumption current in the reading mode can be decreased.

The practicable circuit arrangement of a voltage conversion circuit which delivers the output signal of an address decoder and a selected one of ternary voltage signals of a plus voltage, a minus voltage and the ground potential of circuitry as stated before, according to reading, writing and erasing operation modes is not restricted to the circuit of the embodiment.

Besides, an EEPROM may well be constructed of N-channel MOSFETs, MNOS transistors and some bipolar transistors.

Figure 4:
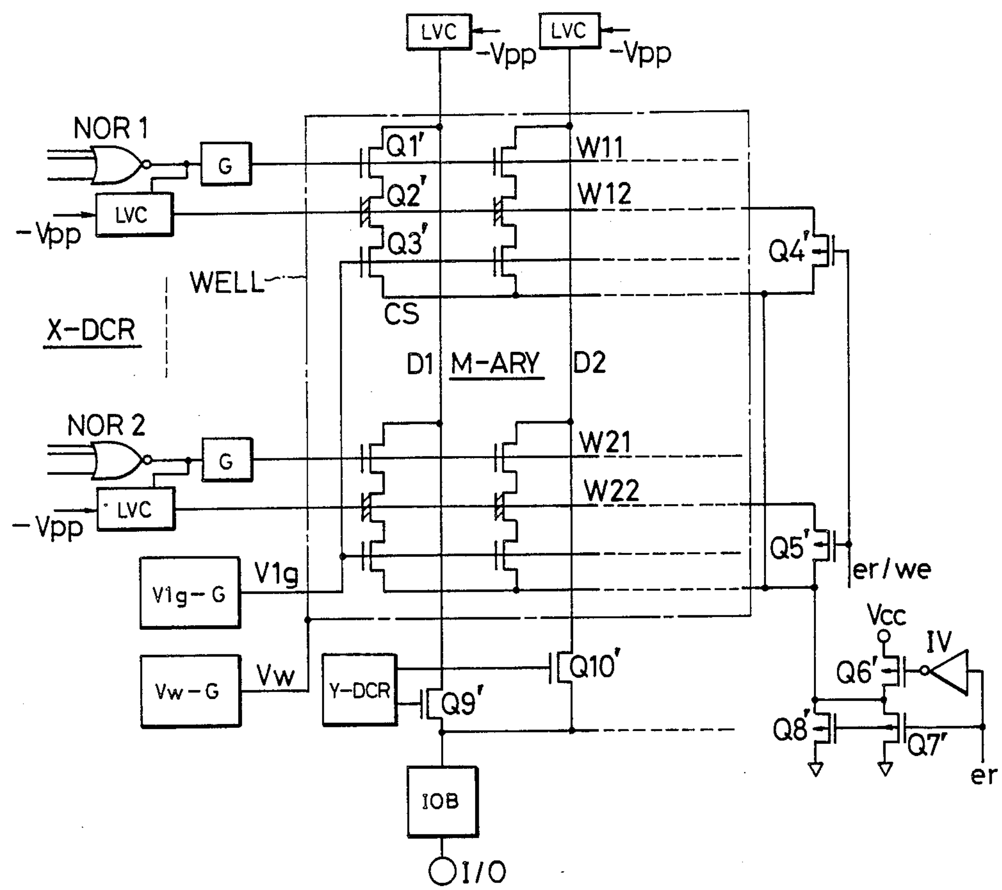
FIG. 4 is a circuit diagram of the essential portions of an EEPROM which is another embodiment of this invention.

FIG. 4 shows another embodiment of the EEPROM of the present invention in which peripheral circuits are constructed of CMOS circuits. In this embodiment, the source of an MNOS Q2′ in each memory cell is furnished with an isolating MOSFET Q3′. All the sources of the isolating MOSFETs Q3′ are coupled to a common source line CS.

In this case, as a switch for controlling the potential of the common source line (for connecting the common source line to a reference potential), an N-channel MOSFET which is brought into its "on" state by a minus potential on the common source line cannot be employed, and P-channel MOSFETs (Q7′, Q8′) are inevitably employed. With the P-channel MOSFET, however, the threshold voltage thereof causes the potential of the common source line to float to a level higher than the ground potential of circuitry. In a reading operation, therefore, as the source potential of the MNOS floats, the effective threshold voltage thereof is raised, and the MNOS transistor endowed with a minus threshold voltage might become inoperative. As regards MNOS technology, refer to the official gazette of Japanese Patent Application Laid-open No. 55-156370 by way of example.

In this embodiment, transistors (Q4′, Q5′) are disposed for short-circuiting the common source line CS and word lines (W12, W22) to which the gate electrodes of the MNOS transistors are coupled.

The EEPROM device of this embodiment includes an address selection circuit which is composed of an address buffer, an X decoder and a Y decoder, a circuit which responds to the output circuit of the address selection circuit and control signals to form a voltage for a writing or erasing operation, and a control circuit which forms the control signals. In the figure, a memory array M-ARY and the selection circuit thereof are shown. The X address decoder X-DCR, etc. constituting the selection circuit is constructed of CMOS circuits. The CMOS circuits operate when fed with a low supply voltage of +5 V. Accordingly, the high level of a selective/unselective signal which is formed by the address decoders X-DCR and Y-DCR is set to be substantially equal to +5 V, and the low level thereof is set to be substantially equal to 0 V being the ground potential of circuitry.

A minus gate voltage $-V_{pp}$ is used for subjecting MNOS transistors to the writing/erasing operations. This voltage $-V_{pp}$ is set at about −12 V, and may be supplied from an external terminal. Alternatively, a pulse signal formed by an oscillation circuit which operates with the above voltage of +5 V may be rectified so as to form the voltage $-V_{pp}$ by means of a level conversion circuit which produces the minus voltage.

In FIG. 4, the memory array M-ARY includes memory cells in a matrix arrangement. As shown by way of example, the memory cell is constructed of an address selecting MOSFET Q1′ which is disposed between the drain of the MNOS transistor Q2′ and a data line (bit line or digit line) D1, and the isolating MOSFET Q3′ which is disposed between the source of the MNOS transistor Q2′ and the common source line CS.

The gates of the respective address selecting MOSFETs Q1′ etc. of the memory cells arranged in an identical row are connected to a first word line W11 in common, and the gates of the MNOS transistors Q2′ etc. corresponding to the MOSFETs Q1′ etc. are connected to the second word line W12 in common. Likewise, the gates of the address selecting MOSFETs and MNOS transistors of the memory cells arranged in another row are respectively connected to a first word line W21 and the second word line W22 in common.

The drains of the address selecting MOSFETs Q1′ etc. of the memory cells arranged in an identical column are connected to the data line D1 in common. Likewise, the drains of the address selecting MOSFETs of the memory cells arranged in another column are all connected to a data line D2 in common.

According to this embodiment, a supply voltage $V_{cc}$ is applied to the body (substrate) gate of the MNOS transistor, thereby to erase the stored data of the MNOS. Therefore, the substrate gate, namely, a semiconductor region WELL in which the memory array M-ARY is formed is electrically isolated from a semiconductor region (well region) in which N-channel MOSFETs constituting the peripheral circuits such as the X decoder and the Y decoder are formed. As will be described later, the well region WELL in which the memory array M-ARY is formed is, for example, a P-type well region which is formed in the surface of an N-type semiconductor substrate. The N-type semiconductor substrate is steadily fed with the supply voltage $V_{cc}$ as of +5 V.

For the erasing described above, the individual memory cells can be respectively formed in independent well regions, or the memory cells arranged in the identical row or column can be formed in a common well region. In this embodiment, however, all the memory cells or the memory array M-ARY are/is formed in the single common well region WELL.

The first word lines W11 and W21 are coupled to the output terminals of gate circuits G to be described later by which the output signals of NOR gate circuits NOR1 and NOR2 constituting the X decoder are selectively transmitted, respectively. The second word lines W12 and W22 are coupled to the output terminals of level conversion circuits LVC which selectively deliver a minus great voltage as of about −12 V in accordance with the output signals of the NOR gate circuits NOR1 and NOR2, respectively. In addition, the gates of the isolating MOSFETs Q3′ etc. are made common and are fed with a control voltage $V_{ig}$ formed by a control voltage generator $V_{ig}$—G. The sources of these isolating MOSFETs Q3′ etc. are all made common to construct the common source line CS, and are selectively fed with the ground potential of the circuitry or the supply voltage $V_{cc}$ through the P-channel MOSFETs Q7′ and Q8′ of parallel form and a P-channel MOSFET Q6′. According to this embodiment, the data lines are brought to a minus gate potential in the writing/erasing operations. Accordingly, as a switching MOSFET whose source potential is rendered a minus potential and which executes on/off operations with signals of ordinary levels (0 V, 5 V) irrespective of such a minus potential, a P-channel MOSFET is inevitably used. The gates of the MOSFETs Q7′ and Q8′ are supplied with a control signal er, and the gate of the MOSFET Q6′ is supplied with the inverted signal of the control signal er produced by an inverter circuit IV. Thus, the MOSFETs Q7′ and Q8′ and the MOSFET Q6′ are complementarily brought into on/off states in accordance with the level of the control signal er. In addition, switching MOSFETs Q4′, Q5′ etc. of the P-channel type which receive a control signal er/we are disposed between the common source line and the second word lines W12, W22 etc. to which the gates of the MNOS transistors are coupled. These switching MOSFETs Q4′, Q5′ etc. are brought into "off" states in the erasing and writing operations as the control signal er/we is rendered the high level thereof, and they are brought into the "on" states in the reading operation as the control signal is rendered the low level thereof. Thus, in the reading operation, the second word lines or the gate voltages of the MNOS transistors are equalized to the source voltages thereof. In this way, even in a case where the potential of the common source line CS floats due to the threshold voltages of the P-channel MOSFETs Q7′ and Q8′ when the ground potential of the circuitry is given to the common source line CS through the MOSFETs Q7′ and Q8′ in the reading operation, the potentials of the second word lines can be responsively equalized. It is accordingly possible to maintain in the "on" states the MNOS transistors having minus threshold voltages of, e.g., −0.5 V. More specifically, the float of the common source line CS incurs the rise of an effective threshold voltage attributed to the substrate effect of the MNOS transistor. As a result, the memory current of the MNOS transistor to flow selectively fails to flow when the threshold voltage thereof is as small as −0.5 V as described above.

As stated above, the sources of the MNOS transistors Q2′ etc. are made common through the isolating MOSFETs Q3′ etc. This dispenses with a source line (reference potential line) which runs in parallel with the data line as in the case of employing a memory cell composed of an MNOS transistor and an address selecting MOSFET, so that the integration density of the memory array can be made higher.

The isolating MOSFETs Q3′ etc. are brought into "off" states in response to the control voltage $V_{ig}$ rendered a low potential as of about −10 V when, in the writing operation of the MNOS transistor to be described later, the first and second word lines W11 and W12 of the selected memory cell are rendered the high level (5 V), the well region WELL being the body gate is rendered about −12 V and the data line D1 is rendered about −10 V. Thus, current is prevented from flowing from the high level (about 5 V) of the data line D2 not selected (with the writing inhibited) to the side of the memory cell to have data written therein.

The well region WELL in which the memory array M-ARY is formed is fed with a control voltage $V_w$ formed by a control voltage generator $V_w$-G. This voltage $V_w$ is brought to a minus gate voltage as of about −12 V in the writing operation, and to a potential of about +5 V in the erasing operation.

Switching MOSFETs Q9′, Q10′ etc. as Y gate circuits are disposed between the respective data lines D1, D2 etc. of the memory array M-ARY and a common data line CD. The gates of these MOSFETs Q9′, Q10′ etc. are fed with the output signals of a Y decoder Y-DCR. The common data line CD is coupled to the output terminal of a data input circuit and the input terminal of a data output circuit, the data input and output circuits constituting an input/output buffer IOB. The input terminal of the data input circuit and the output terminal of the data output circuit constituting the input/output buffer IOB are coupled to an external terminal I/O.

Though not especially restricted, each of the data lines D1, D2 etc. is furnished with a level conversion circuit LVC which brings the voltage of the selected data line to the minus gate voltage $-V_{pp}$ in accordance with the level thereof for the writing operation.

Figure 5:
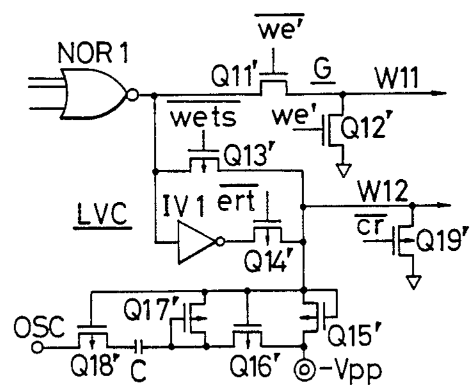
FIG. 5 is a circuit diagram of an embodiment of circuit blocks G and LVC shown in FIG. 4.

FIG. 5 shows a circuit diagram of one embodiment of the gate circuit G and the level conversion circuit LVC which construct the unit circuit of the X decoder X-DCR.

The gate circuit G is constructed of an N-channel MOSFET Q11′ which transmits the output signal of the NOR gate circuit NOR1 to the first word line W11 in accordance with a control signal $\overline{we}'$, and an N-channel MOFET Q12′ which applies the ground potential of the circuitry to the first word line W11 upon receiving a control signal we′ opposite in phase to the above control signal $\overline{we}'$. More specifically, in the writing operation, the transfer gate MOSFET Q11′ is brought into the "off" state by the low level of the control signal $\overline{we}'$, while the MOSFET Q12′ is brought into the "on" state by the high level of the control signal we′ so that the first word lines W11 etc. are all rendered the ground potential of the circuitry. In the erasing or reading operation, the transfer gate MOSFETs Q11′ etc. are brought into the "on" states by the high level of the control signal $\overline{we}'$ and the low level of the control signal we′, whereupon the first word line W11 is rendered a high level or a low level conforming to the output signal of the NOR gate circuit NOR1. That is, the word line W11 is brought to the high level (5 V) if in the selected state and to the low level (0 V) if in the unselected state.

The level conversion circuit LVC is constructed of MOSFETs Q13′-Q19′ and an inverter circuit IV1. The output terminal of the NOR gate circuit NOR1 is coupled to the second word line W12 through the P-channel type transfer gate MOSFET Q13′ which receives a control signal $\overline{wets}$. Besides, the output terminal of the inverter circuit IV1 which receives the output signal of the NOR gate circuit NOR1 is coupled to the second word line W12 through the P-channel type transfer gate MOSFET Q14′ which receives a control signal $\overline{ert}$. According to the level thereof, the second word line W12 is selectively rendered the minus gate voltage $-V_{pp}$ by the level conversion circuit to be described now. The circuit which brings the word line W12 to the minus gate voltage $-V_{pp}$ selectively is constructed of the following circuit elements: Though no special restriction is intended, the P-channel MOSFET Q15′ of diode form which is adapted to cause current to flow from the minus voltage $-V_{pp}$ toward the word line W12 is disposed between the second word line W12 and the minus voltage terminal $-V_{pp}$. Disposed between the minus voltage terminal $-V_{pp}$ and one electrode of a capacitor C is the P-channel MOSFET Q16' whose gate is coupled to the side of the second word line W12. Disposed between the above electrode of the capacitor C and the second word line W12 is the P-channel MOSFET Q17' of diode form which is adapted to cause current to flow from the word line side. The other electrode of the capacitor C is supplied with an oscillation pulse formed by an oscillation circuit OSC not shown, through the P-channel MOSFET Q18' whose gate is coupled to the side of the second word line W12. In addition, the word line W12 is endowed with the ground potential of the circuitry before the level conversion circuit starts its level conversion operation, by the P-channel MOSFET Q19' which receives a control signal $\overline{cr}$.

The level conversion operation of this embodiment is as stated below.

By ay of example, in the erasing operation, first of all, the control signal $\overline{cr}$ is temporarily rendered the low level to reset the second word line W12 to the ground potential of the circuitry. Thereafter, the control signal $\overline{ert}$ is rendered the low level. Thus, the MOSFET Q14' is brought into the "on" state. For example, if the selective signal of the high level has been delivered from the NOR gate circuit NOR1, the signal of the low level is transmitted to the MOSFET Q14' through the inverter circuit IV1. The gate and source of the MOSFET Q14' are therefore rendered equipotential, with the result that the MOSFET Q14' is brought into the "off" state. Thus, the second word line W12 maintains the low level in the floating state thereof. When the second word line W12 is at the low level in the floating state, the oscillation pulse rendered the high level brings the MOSFET Q18' into the "on" state and percharges the capacitor C. Subsequently, when the oscillation pulse is rendered the ground potential of the circuitry, the capacitor C forms a minus potential owing to the bootstrap function. The MOSFETs Q17' and Q16' are brought into the "on" states by the minus potential, and the potential of the second word line is lowered by the minus voltage $-V_{pp}$ in correspondence with the minus voltage component based on the bootstrap function. Next, when the oscillation pulse is rendered the high level, the capacitor C is precharged to a level which is greater by the above minus voltage. Owing to the repetition of a similar operation, therefore, the potential of the second word line W12 is lowered down to a low potential as of about −10 V if the minus voltage $-V_{pp}$ is the minus gate voltage as of about −12 V. It is to be added that, since the threshold voltages of the MOSFETs Q17' and Q16' of diode form are existent, the potential of the word line W12 lowers only to the potential as of −10 V even with the minus voltage $V_{pp}$ of −12 V as described above. Meanwhile, when the unselective signal of the low level has been delivered from the NOR gate circuit NOR1, the signal of the high level is transmitted to the MOSFET Q14' through the inverter circuit IV1, and hence, the potential of the second word line W12 is rendered the high level as of about 5 V.

In the writing operation, the control signal $\overline{cr}$ is temporarily rendered the low level to reset the second word line W12 to the ground potential of the circuitry, whereupon the control signal $\overline{wets}$ is rendered the low level. Thus, the MOSFET Q13' is brought into the "on" state. By way of example, when the selective signal of the high level has been delivered from the NOR gate circuit NOR1, the potential of the second word line 12 is brought to the high level as of about 5 V contrariwise to the erasing operation explained above, and when the unselective signal of the low level has been delivered, the potential of the second word line W12 is brought to −10 V by the operation of the level conversion circuit LVC.

Figure 6:
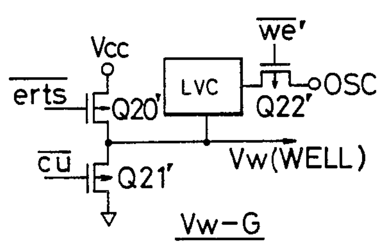
FIG. 6 is a circuit diagram of an embodiment of a circuit block Vw-G shown in FIG. 4.

FIG. 6 shows a circuit diagram of one embodiment of the control voltage generator $V_w$-G for the well WELL in which the memory array M-ARY is formed.

This circuit is constructed of a P-channel MOSFET Q20' which receives a control signal $\overline{erts}$ and provides +5 V for the erasing operation, a P-channel MOSFET Q21' which receives a control signal $\overline{cu}$ to temporarily fall into the "on" state and to once reset the well to the ground potential of the circuitry in the writting operation, and a level conversion circuit LVC similar to the foregoing, which receives the low level (ground potential) in the flating state and lowers it to the minus voltage $-V_{pp}$ as of −12 V. The oscillation pulse OSC required for the level conversion operation of the circuit LVC is fed through a transfer gate MOSFET Q22' of the P-channel type which receives the write control signal $\overline{we'}$.

The control voltage generator $V_{ig}$-G which forms the control voltage $V_{ig}$ to be fed to the gates of the isolating MOSFETS Q3' etc. is constructed of a circuit similar to the circuit shown in FIG. 6, except that the control signals are different. In addition, the level conversion circuit LVC provided for the data line is constructed of a circuit similar to that of FIG. 5. However, it will be needless to say that the level conversion operation of the circuit LVC is performed in accordance with the level of the write signal of the selected data line, not with the output signal of the address decoder.

In the erasing operation, the well region WELL is rendered +5 V, and the second word line is rendered −10 V, whereby the electrons of the floating gate are restored to the body gate side. Besides, in the writing operation, the second word line to which the gate of the MNOS transistor to have data written therein is coupled is rendered +5 V, the well region WELL is rendered −12 V, the data line of the MNOS transistor corresponding to logic "1" is rendered −10 V, and the data lines corresponding to logic "0" (with the writing inhibited) are rendered +5 V.

In the reading operation, the data line selected by the Y gate is coupled to the input terminal of the sense amplifier included in the data output circuit. The sense amplifier senses current flowing through the memory cell coupled to the selected data line and word line, thereby to read out the stored data of the memory cell.

According to the embodiment shown in FIG. 4, the following effects are produced:

(1) In a memory cell wherein an isolating MOSFET is disposed between the source of an MNOS transistor and a common source line, a short-circuiting MOSFET which is turned "on" in a reading operation is disposed between the gates of the MNOS transistors and the source line made common through the isolating MOSFETs, whereby the gates and sources of the MNOS transistors can be equalized in potential. This brings forth the effect that the MNOS transistors are permitted to cause currents conforming to their threshold voltages to flow irrespective of the floating of the common source line.

(2) The sources of MNOS transistors are made common through isolating MOSFETs, whereby reference potential lines which otherwise run in parallel with the data lines of a memory array can be dispensed with.

This brings forth the effect that a higher density of integration of the memory array can be realized.

We claim:

1. A semiconductor memory device comprising:

a first semiconductor region of a first conductivity type;

a second semiconductor region of a second conductivity type which is formed in said first semiconductor region;

a memory cell formed in said second semiconductor region, said memory cell including a MNOS transistor which can electrically write and erase data;

a peripheral circuit which is formed in said first semiconductor region to have a predetermined relation to said memory cell and which includes a series circuit having a P-channel MISFET and an N-channel MISFET; and voltage providing means coupled to said MNOS transistor, to said first semiconductor region and to said second semiconductor region, wherein said voltage providing means provides a first voltage of a first polarity to a gate electrode of said MNOS transistor, a second voltage of a second polarity to said second semiconductor region and a predetermined voltage of said first polarity to said first semiconductor region when data is to be written into said MNOS transistor, and further wherein said voltage providing means provides a third voltage of said second polarity to the gate electrode of said MNOS transistor, a fourth voltage of said first polarity to said second semiconductor region and said predetermined voltage to said first semiconductor region when data in said MNOS transistor is to be erased, and wherein said first polarity is the opposite polarity to said second polarity.

2. A semiconductor memory device according to claim 1, wherein said first conductivity type is an N-conductivity type, and said second conductivity type is a P-conductivity type.

3. A semiconductor memory device according to claim 2, wherein said first voltage, said second voltage, said third voltage, said fourth voltage and said predetermined voltage are a plus voltage, a minus voltage, a minus voltage, a plus voltage and a fixed plus voltage, respectively.

4. A semiconductor memory device according to claim 3, wherein a potential level of said first voltage is substantially equal to that of said fourth voltage, and a potential level of said second voltage is substantially equal to that of said third voltage.

5. A semiconductor memory device according to claim 3, wherein said first semiconductor region is a semiconductor substrate, and said second semiconductor region is a region formed in one major surface of said semiconductor substrate.

6. A semiconductor memory device comprising:

a first semiconductor region of a first conductivity type;

a plurality of memory cells which are formed within a second semiconductor region of a second conductivity type provided in said first semiconductor region; and peripheral circuits which are formed in said first semiconductor region to have a predetermined relation to said plurality of memory cells, wherein each memory cell includes a MNOS transistor, and each peripheral circuit includes a series circuit having a P-channel MISFET and an N-channel MISFET.

7. A semiconductor memory device according to claim 6, wherein said first conductivity type is an N-type, and said second conductivity type is a P-type.

8. A semiconductor memory device according to claim 7, wherein one of said peripheral circuits includes a voltage conversion circuit which forms a plus, minus or ground potential for causing said MNOS transistor to perform an operation of writing, erasing or reading data.

9. A semiconductor memory device comprising:

a first semiconductor region of a first conductivity type;

a plurality of memory cells which are formed in a second semiconductor region of a second conductivity type which is formed in said first semiconductor region, and a peripheral circuit which is formed in said first semiconductor region to have a predetermined relation to said memory cells, wherein said each memory cell includes a single MNOS transistor, an addressing MOSFET disposed on a drain side of said MNOS transistor, and an isolating MOSFET disposed on a source side of said MNOS transistor, and said peripheral circuit includes a series circuit having a P-channel MISFET and an N-channel MISFET.

10. A semiconductor memory device according to claim 9, wherein said first conductivity type is an N-type, and said second conductivity type is a P-type.

11. A semiconductor memory device according to claim 10, further comprising a common source line to which said isolating MOSFETs are all connected in common, a word line to which gate electrodes of said MNOS transistors are connected in common, and a MOSFET which short-circuits said common source line and said word line in a reading operation.

12. A semiconductor memory device according to claim 11, wherein said first semiconductor region is a semiconductor substrate, and said second semiconductor region is a well region formed in said semiconductor substrate.

13. A semiconductor memory device comprising:

a semiconductor substrate of an N-conductivity type;

a plurality of memory cells which are formed in a well region of a P-conductivity type, each memory cell including a single MNOS transistor; and peripheral circuits formed in said semiconductor substrate to have a predetermined relation to said memory cells and including voltage conversion means having a series circuit with a P-channel MISFET and an N-channel MISFET;

said voltage conversion means providing a plus voltage to be applied to a gate electrode of a MNOS transistor and a minus voltage to be applied to said well region when data is to be written into the MNOS transistor, said voltage conversion means providing a minus voltage to be applied to the gate electrode of a MNOS transistor and a plus voltage to be applied to said well region when data in the MNOS transistor is to be erased, and providing a fixed plus voltage to said semiconductor substrate in the writing and erasing modes.

14. A semiconductor memory device according to claim 13, wherein said voltage conversion means includes further means for providing a ground potential to a gate electrode of a MNOS transistor when data in the MNOS transistor is to be read out.

15. A semiconductor memory device according to claim 14, wherein said voltage conversion means includes still further means for providing a ground potential to a source electrode of each of the MNOS transistors in the reading mode.

16. A semiconductor memory device according to claim 13, wherein the fixed plus voltage applied to said semiconductor substrate is substantially 5 volts.

* * * * *